United States Patent [19]

Komatsubara et al.

[11] 4,063,201
[45] Dec. 13, 1977

[54] PRINTED CIRCUIT WITH INDUCTIVELY COUPLED PRINTED COIL ELEMENTS AND A PRINTED ELEMENT FORMING A MUTUAL INDUCTANCE THEREWITH

[75] Inventors: Michimasa Komatsubara; Toshihiko Waku, both of Tokyo; Tetsuya Fukai, Yokohama; Akito Satsuka, Fujisawa, all of Japan

[73] Assignees: Sony Corporation; Soshin Electric Company Limited, both of Japan

[21] Appl. No.: 478,534

[22] Filed: June 12, 1974

[30] Foreign Application Priority Data

June 16, 1973 Japan .................................. 48-71319
June 16, 1973 Japan .................................. 48-71320

[51] Int. Cl.² .................... H03H 7/08; H03H 13/00; H01G 4/40; H01F 27/40
[52] U.S. Cl. .................... 333/70 R; 333/70 S; 333/79
[58] Field of Search .................... 333/70 S, 70 R, 77, 333/84 M; 336/200, 232, 223, 170; 317/101 R, 101 A, 101 B

[56] References Cited

U.S. PATENT DOCUMENTS

| 2,252,092 | 8/1941 | Newman | 334/75 X |
| 2,688,119 | 8/1954 | Gere | 333/84 M X |
| 2,751,558 | 6/1956 | Grieg et al. | 333/84 M X |
| 2,759,098 | 8/1956 | White et al. | 333/70 S X |
| 2,762,987 | 9/1956 | Mackey | 334/61 X |
| 2,951,149 | 8/1960 | Grieg et al. | 333/84 M X |
| 3,512,254 | 5/1970 | Jenkins et al. | 29/620 |
| 3,665,570 | 5/1972 | Brooks | 317/2 R |
| 3,858,126 | 12/1974 | Kameya | 333/70 R X |
| 3,947,934 | 4/1976 | Olson | 333/70 S X |

OTHER PUBLICATIONS

"Reference Data for Radio Engineers", Howard W. Sams and Co., Inc. New York, 1968, pp. 20–23.
Dishall, "Gaussian-Response Filter Design" in Electrical Communication, vol. 36, No. 1, 1959; pp. 3 & 9–10.

*Primary Examiner*—Alfred E. Smith
*Assistant Examiner*—Marvin Nussbaum
*Attorney, Agent, or Firm*—Hill, Gross, Simpson, Van Santen, Steadman, Chiara & Simpson

[57] ABSTRACT

A printed circuit including a first conductor formed on an insulating plate as an inductance element, a second conductor formed on the insulating plate as an inductance element which is inductively coupled to the first element, and a common conductor formed on the insulating plate between the first and second elements and mutually inductively coupled to the first and second elements to provide a predetermined desired coefficient of coupling between the first and second elements. A preferred detailed form of the invention additionally includes printed capacitor elements in circuit with the inductance elements to provide an electric band-pass wave filter.

7 Claims, 11 Drawing Figures

PRINTED CIRCUIT WITH INDUCTIVELY COUPLED PRINTED COIL ELEMENTS AND A PRINTED ELEMENT FORMING A MUTUAL INDUCTANCE THEREWITH

BACKGROUND OF THE INVENTION

1. Field of the Invention

This invention relates generally to a printed circuit, and more particularly is directed to a printed circuit suitable for use as an electric wave filter.

2. Description of the Prior Art

Radio receivers and television receivers customarily employ a number of resonant circuits which are used as electric wave filters to select desired frequency signal. Such filters commonly consist of primary and secondary coils and a capacitor, and are usually referred to as band-pass filters. The filter also often has means for adjusting the coupling factor such, for example, as by a bar made of magnetic material. Because there has been a definite trend in present times to make radio receivers and other electronic apparatus as small as possible in size, there has been an effort made to improve the structure and form of such filters.

To this end, and in order to make such filters small in size, it has been proposed to use a printed circuit technique where the conductors corresponding to the primary and secondary coils are printed on one or both surfaces of a thin insulating plate. Under such circumstances, the insulating plate with the conductors is also used as a capacitor. With the employment of such a printing technique, the filter can be made small in size, but it has been difficult to determine or adjust the mutual inductance or, in other words, the coupling factor. By way of example, in the prior art, the above determination or adjustment is carried out by inserting a magnet into or out of the center of the printed coil or by changing the shape of the coil. With the method of obtaining a predetermined coupling factor by determining the shape of the coil, it is possible to reduce the size of the filter, but this method has been found undesirable because of the difficulty of obtaining a high Q product.

Further, with the prior art filter formed as a printed circuit, and since the electro-magnetic coupling and electro-static coupling are independent of each other, the frequency selection characteristic is not sharp and the spurious signals in the high frequency bands appear with relatively high level.

SUMMARY OF THE INVENTION

The present invention provides a novel printed circuit arrangement in which inductance elements are formed on one or both surfaces of an insulating plate, and in which an additional printed conductor is provided and so arranged as to provide a coefficient of coupling between the first and second inductance elements of desired value. A novel band-pass wave filter is provided by additionally printing capacitor elements on the insulating plte which are electically connected in circuit with the first and second inductance elements.

It is an object of the present invention to provide a printed circuit in which printed inductance elements are inductively coupled and in which a printed mutual inductance element is formed to easily obtain a desired coupling factor.

It is another object of the invention to provide a printed circuit with which a coupling factor can be easily adjusted.

It is a further object of the invention to provide a printed circuit with a high Q characteristic.

It is a further object of the invention to provide a printed circuit in which coils are printed on both surfaces of an insulating plate and the insulating plate is utilized as a capacitor to form a filter of small size.

It is a further object of the invention to provide a printed circuit in which a filter with capacitor coupling and electro-magnetic coupling connected in series is formed on an insulating plate to improve the frequency selection characteristic.

It is a yet further object of the invention to provide a printed circuit which greatly reduces the generation of spurious signals.

Other objects, features and advantages of the invention will be apparent from the following description taken in conjunction with the accompanying drawings.

DESCRIPTION OF THE PREFERRED EMBODIMENTS

Figure 1A:
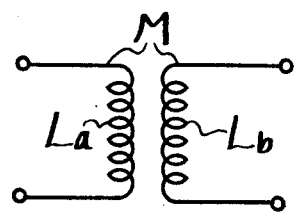
FIG. 1A is a schematic diagram of an electric circuit showing a pair of inductance elements inductively coupled.
Figure 1B:
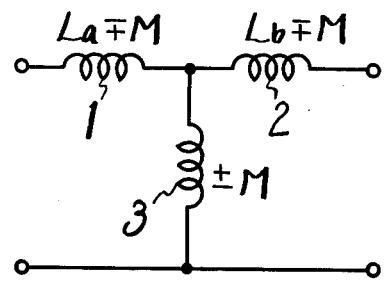
FIG. 1B is an equivalent circuit of the circuit shown in FIG. 1A.

In a circuit in which primary and secondary coils are electro-magnetically coupled as shown in FIG. 1A, if self-inductances of the primary and secondary coils are taken as $La$ and $Lb$, respectively, and the mutual inductance therebetween is taken as $M$, its equivalent circuit becomes a T-type circuit as shown in FIG. 1B. In FIG. 1B, the inductances of the first, second and third coils 1, 2 and 3 can be expressed as $La \mp M$, $Lb \mp M$ and $\pm M$, respectively. In this case it should be noted that the third coil 3, which has the mutual inductance $M$, can be expressed independently.

With the printed circuit according to the invention, the third coil shown in the equivalent circuit is independently made as a printed one to select the mutual inductance or the coupling factor independently.

Figure 2:
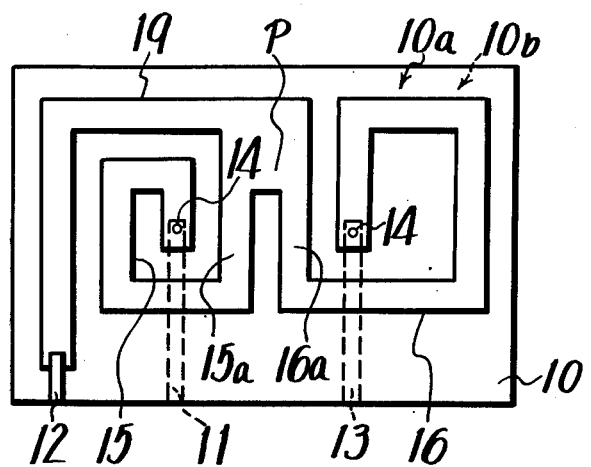
FIG. 2 is a front view showing the pattern of an embodiment of the printed circuit according to the present invention.

An embodiment of the printed circuit, according to the present invention, will be now described with reference to FIG. 2. An insulating plate 10 of mica or the like is provided. First and second conductors 15 and 16 are formed or coated on one surface 10a of the insulating plate 10 by any conventional printing technique to form a coil pattern or a pattern similar thereto with inductances. The conductors 15 and 16 are connected together at a connection point P and a portion 19 is extended from the connection point P to be a common conductor or common coil. The extended common conductor 19 from the first and second conductors 15 and 16 is trimmed to adjust finely the coupling factor between the first and second conductors 15 and 16. In FIG. 2, reference numeral 11 indicates an input terminal formed on the other surface 10b of the insulating plate 10; 12 indicates a ground terminal formed on the surface 10a of the insulating plate 10 and connected to the common electrode 19; 13 indicates an ouput terminal formed on the surface 10b of the insulating plate 10; and 14 indicates conductive connecting devices by throughholes which connect the conductor 15 with the terminal 11, and the conductor 16 with the terminal 13, respectively.

Figure 3:
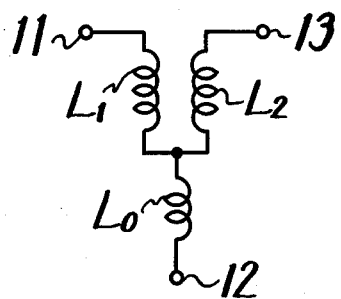
FIG. 3 is the connection diagram of the pattern of the printed circuit shown in FIG. 2.

FIG. 3 shows an electric circuit of the embodiment of the printed circuit according to the invention shown in FIG. 2. As shown in FIG. 3, the first conductor 15 serves as an inductor $L_1$, the second conductor 16 as an inductor $L_2$, and the common conductor 19 as a mutual inductor $L_O$, respectively. The inductors $L_1$ and $L_2$ are magnetically coupled. In this arrangement, it is preferable that portions 15a and 16a of the first and second conductors 15 and 16 are formed to be parallel with each other as shown in FIG. 2.

With the embodiment shown in FIG. 2, the common conductor 19 forms the common inductor $L_O$, so that the coupling factor between the conductors 15 and 16 can be selected to have a high value, as compared with the case where two conductors are formed independently, for example, 0.1 to 0.3. Thus, the desired coupling can be obtained. Further, since the common conductor 19 is trimmed near the connection point P, the coupling factor between the conductors 15 and 16 can be adjusted finely even in the order of 0.1 or lower.

Figure 4:
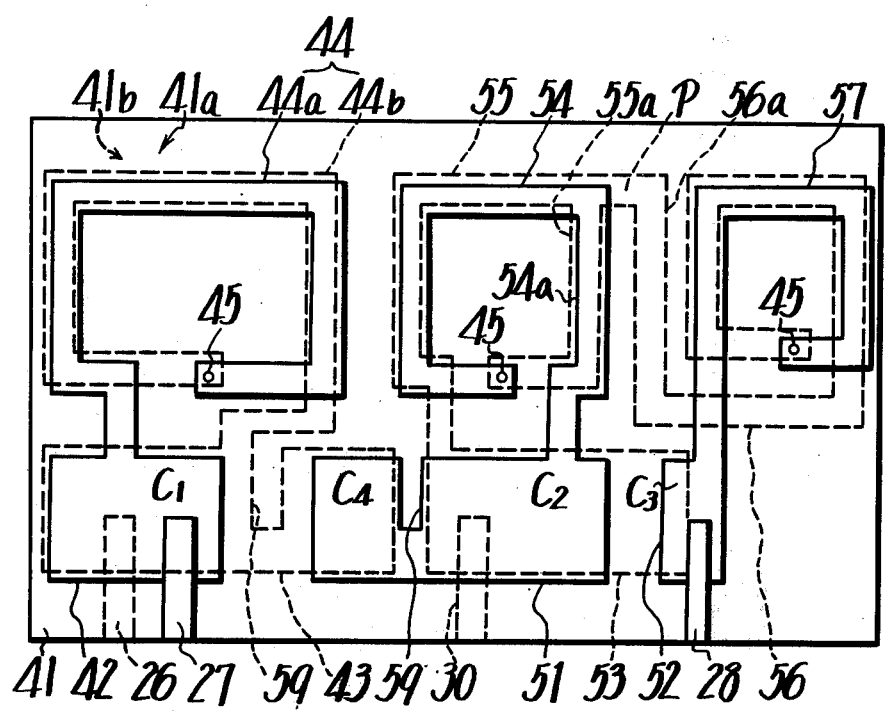
FIG. 4 is a front view showing the pattern of another embodiment of the printed circuit according to the present invention.
Figure 5:
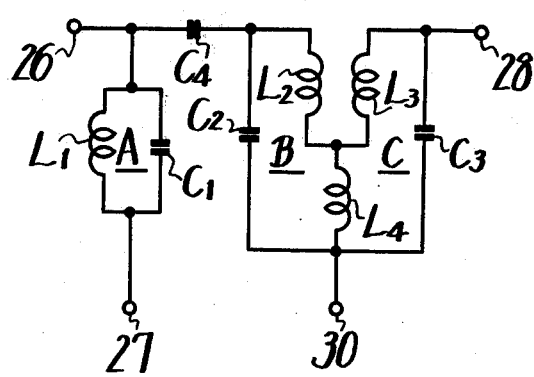
FIG. 5 is the connection diagram of the pattern of the printed circuit shown in FIG. 4.

FIG. 4 shows an embodiment of filters in which the present invention is used, and FIG. 5 shows its electric circuit. In this embodiment, at least first, second and third resonant circuits A, B and C are provided, respectively as shown in FIG. 5. In this case, the interstage coupling of each stage is achieved by a capacitor and an electro-magnetic coupling element. In the embodiment of FIGS. 4 and 5, the coupling between the first and second stages (i.e., the first and second resonant circuits A and B) is a capacity-coupling (C-coupling), obtained by a capacitor $C_4$ and the coupling between the second and third stages (i.e., resonant circuits B and C) is an electro-magnetic coupling (M-coupling) obtained by inductors $L_2$, $L_3$ and $L_4$. In this illustrated embodiment, the coupling between the ciruits B and C is achieved by connecting the inductors $L_2$ and $L_3$ at their lower ends to the common inductor $L_4$. In the figure, reference symbols $L_1$ and $C_1$ indicate an inductor and a capacitor which form the first resonant circuit A; $L_2$, $L_4$ and $C_2$ indicate inductors and a capacitor which form the second resonant circuit B; and $L_3$, $L_4$ and $C_3$ indicate inductors and a capacitor which form the third resonant circuit C, respectively. Further, in the figure, reference numeral 26 designates an input terminal, 28 an output terminal, and 27 and 30 the ground terminal, respectively.

Referring to FIG. 4 the pattern of the filter shown in FIG. 5 will be now described. A film like insulating plate 41 made of mica or the like is prepared, and a pair of plane electrodes 42 and 43 are formed or coated on both surfaces 41a and 41b of the insulating plate 41 in opposed relation through the plate 41 by a conventional printing technique so as to form the capacitor $C_1$. A conductor 44, which connects the plane electrodes 42 and 43, is formed on one of or both of the surfaces 41a and 41b with a pattern of whirl, or similar one, so as to give a predetermined inductance at a predetermined high frequency. In the embodiment of FIG. 4, the conductor 44 is divided into two parts 44a and 44b. The part 44a is formed or coated on the surface 41a of the insulating plate 41, and the other part 44b is coated on the other surface 41b of the insulating plate 41. One ends of the conductors 44a and 44b are electrically connected by a connecting device 45 made of electrically conductive material which passes through the plate 41 by a so-called through-hole means.

The input terminal 26 is connected to one of the plane electrodes 42 and 43 or the plane electrode 43, and the ground terminal 27 is connected to the other plane electrode 42, in the illustrated embodiment.

Plane electrodes 51 and 52 are further formed or coated on the surface 41a of the insulating plate 41, respectively, and a plane electrode 53 is formed or coated on the other surface 41b of the insulating plane 41 in opposed relation to the plane electrode 51 to form the capacitor $C_2$. The plane electrodes 51 and 53 are electrically connected by conductors 54 and 55 which are coated together with the electrodes 51 and 53 on the surfaces 41a and 41b of the insulating plate 41 through the connecting device 45. The plane electrode 51 is partially opposed to the plane electrode 43 to form the coupling capacitor $C_4$. Accordingly, the C-coupling is performed here.

The second and third stage resonant circuits B and C are M-coupled, respectively, and the lower ends of the inductors $L_2$ and $L_3$ are connected together to the common inductor $L_4$ in the embodiment shown in FIG. 5. To this end, in the embodiment of FIG. 4, a whirled conductor 56 is formed on the surface 41b of the insulating plate 41 and a part 56a thereof is formed to be substantially parallel to parts 54a and 55a of the whirled conductors 54 and 54, respectively, to form the M-coupling portion therebetween. The coupling portion 56a is connected to the conductor 55 at a point P to make the portion from the connecting point P to the plane electrode 53 as the inductor $L_4$ shown in FIG. 5. A whirled conductor 57 is also formed on the surface 41a of the plate 41 which is electrically connected to the plane electrode 52 which is connected at its one end to one end of the conductor 56 through the connecting device 45. Although the plane electrodes 52 and 53 are partially opposed to form the capacitor $C_3$, it is not always required that the electrodes 52 and 53 are opposed partially. Under some circumstances the stray capacity between the conductors 56 and 57 may be used as the capacitor $C_3$. Due to the employment of the M-coupling as in this embodiment, the capacitor $C_2$ and $C_3$ can be selected with large capacitance values as compared with that of the C-coupling, so that the inductance elements can be easily coated on the surfaces 41a and 41b of the plate 41 to provide a maximum Q. Thus, the conductor 44 becomes the inductor $L_1$, parts of the conductors 54 and 55 become the inductor $L_2$, and the conductors 56 and 57 become as the inductor $L_3$, respectively.

In the embodiment of FIG. 4, recesses 59 are formed in the plane electrodes 43 and 51, respectively, close to the ground terminal 27 between the output side of the resonant circuit A and the capacitor $C_4$.

Figure 6A:
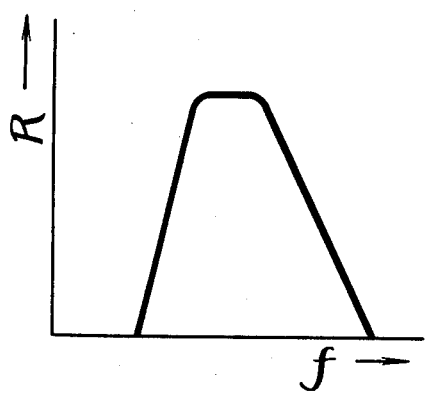
FIGS. 6A to 6C, inclusive, are graphs showing the frequency characteristics of the connection shown in FIG. 5.
Figure 6B:
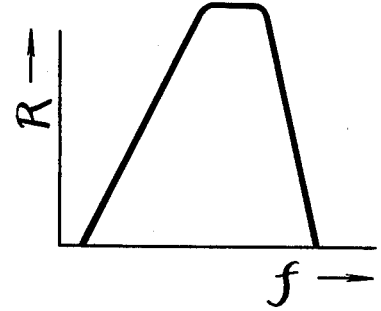

Generally speaking, as shown in the graph of FIG. 6A in which the ordinate represents response R and the abscissa the frequency $f$, according to the C-coupling, the skirt portion of the band-pass characteristic at the higher side tends to be expanded as compared with that at the lower side, but according to the M-coupling, the skirt at the lower side tends to be expanded as compared with that at the higher side as shown in FIG. 6B. That is, the characteristics become asymmetrical.

Figure 6C:
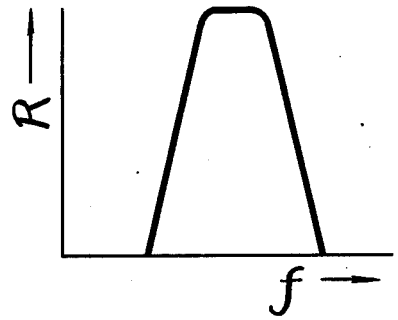

With this invention, on the contrary, the first and second resonant circuits A and B are coupled in the manner of a so-called C-coupling by the capacitor $C_4$, and the second and third resonant circuits B and C are coupled in the manner of a so-called M-coupling which is shown in FIG. 5. Hence, as shown in FIG. 6C, the characteristic of the filter according to this invention has the feature that its lower side is similar to that of the characteristic shown in FIG. 6B. Therefore the band-pass characteristic of the filter according to the invention is superior in symmetry as a whole, and hence the filter of the present invention has a sharp band-pass characteristic.

In the embodiment shown in FIG. 5, the first, second and third resonant circuits A, B and C have been used as exemplary; but a greater number of resonant circuits may be employed and connected in cascade in a manner similar to that mentioned above to perform the similar effects.

Further, in the case where the plane electrodes 42 and 43 are formed on the both surfaces of the thin plate 41, respectively, and therefrom the lead wires or the input and ground terminals 26 and 27 are led out as shown in FIG. 4, it is sometimes difficult to lead out the electrodes 26 and 27 from the points opposed through the plate 41. Accordingly, in such a case, if the terminals 26 and 27 are led out from different or shifted positions, the manufacture thereof can be made easily.

With the construction as mentioned above, a current path is formed between the input terminal 26 and the ground terminal 27 and the current path has inductance from high frequency point of view, so that a voltage difference may be established therebetween. As a result, a certain voltage can be obtained at the part of the plane electrode 43 which forms the capacitor $C_4$. This voltage might cause spurious signals. However, with the construction shown in FIG. 4, the recess 59 is formed in the electrode 43 at the position opposite to the ground terminal 27 or close thereto, so that when the current caused by the above mentioned voltage tends to flow to the output terminal side, this current is concentrated at the narrow portion of the electrode 43 by the recess 59. At this time, since the ground terminal 27 is provided at a position opposed or near to that mentioned above, a large part of the current flows to the ground and hence almost no current flows to the output side. As a result, the generation of spurious signals is greatly reduced.

Figure 7A:
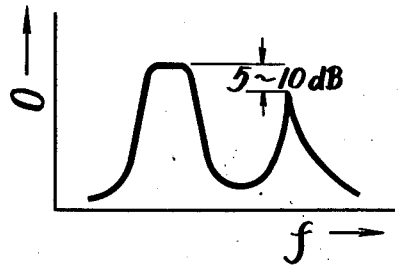
FIGS. 7A and 7B are graphs showing the characteristics used for the explanation of the operation of the printed circuit shown in FIG. 4.
Figure 7B:
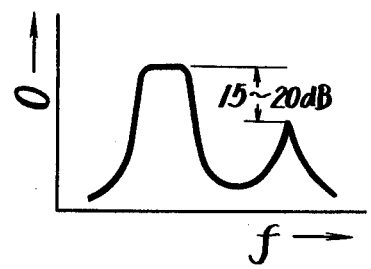

FIGS. 7A and 7B show the above mentioned difference. That is, FIG. 7A shows the case where there is no recess and FIG. 7B shows the case where the recess 59 is provided. In FIGS. 7A and 7B, the ordinate represents an output O and the abscissa represents the frequency $f$. The recess 59 provided in the electrode 51 operates similarly.

It may be apparent to those skilled in the art that many modifications and variations could be effected without departing from the spirit and scope of the novel concepts of the present invention.

We claim as our invention:

1. A printed circuit adapted to function as a bandpass filter for a selected band of frequencies comprising:
    a. a first conductor formed as a first inductance element on an insulating plate;
    a second conductor formed as a second inductance element on said insulating plate electromagnetically coupled to said first inductance element; one end of each of said first and second inductance elements being connected at a common point, the other ends of said first and second inductance elements being connected to first and second input and output terminals respectively; and
    c. a common conductor formed as a third inductance element connected at one end to said common point of said first and second inductance element on said insulating plate, and the other end being connected to a ground terminal, whereby said common conductor inductance element determines the mutual inductance of the printed circuit.

2. A printed circuit adapted to function as a bandpass filter for a selected band of frequencies comprising:
    a. a first conductor formed as a first inductance element on an insulating plate;
    b. a second conductor formed as a second inductance element on said insulating plate electromagnetically coupled to said first inductance element, one end of each of said first and second inductance elements being connected at a common point, the other ends of said first and second inductance elements being connected to first and second input and output terminals respectively; and
    c. a common conductor formed as a third inductance element connected at one end to said common point of said first and second inductance elements on said insulating plate, and the other end being connected to a ground terminal, whereby said common conductor inductance element determines the mutual inductance of the printed circuit, said common conductor having a trimmed portion near the position at which said first and second conductors are connected thereto, thereby enabling adjustment of the coupling factor between said first and second conductors by changing inductance of the common conductor.

3. A printed circuit board having inductance elements printed thereon, including at least one pair of whirled inductance elements and a common whirled inductance element connecting to one end of each element of said pair at a point intermediate said pair, said common inductance element forming a mutual inductance element for adjusting the coupling factor of said pair to a predetermined value.

4. An electric band-pass wave filter comprising an insulating plate having a plurality of whirled conductors printed thereon forming inductance elements, at least some of said inductance elements being positioned to provide a pair of electromagnetically coupled inductance elements, a printed conductor on said plate forming a mutual inductance element having a trimmed portion to control the coupling factor of said pair of inductance elements, a plurality of electrodes printed on opposite sides of said plate to provide a plurality of capacitor elements, input and output terminals on said plate, and a plurality of conductors printed on said plate which electrically connect said inductance and capacitance elements in a bandpass filter array.

5. A printed circuit adapted to function as a bandpass filter for a selected band of frequencies comprising:
    a. a first conductor formed as an inductor on an insulating plate to have inductance;

b. a second conductor formed as an inductor on said insulating plate to have inductance; and
c. a common conductor formed as an inductor on said insulating plate to have inductance, one end of said common conductor being connected to one end of each of said first and second conductors and providing a connection at a point intermediate said first and second conductors;
d. a first resonant circuit connected to an input of the printed circuit and formed of first and second plane electrodes on opposite sides of said insulating plate, said plane electrodes being shaped to provide a first coil, first capacitor, and part of a second coupling capacitor; p1 e. a second resonant circuit connected to said first resonant circuit by said second coupling capacitor and formed of third and fourth plane electrodes on opposite sides of said insulating plate, said third plane electrode comprising said first conductor, second conductor, and common conductor, said third and fourth plane electrodes providing second and third coils and a third capacitor for said second resonant circuit; and
f. a third resonant circuit connected to said first resonant circuit and an output of the printed circuit, said third resonant circuit being formed of said fourth plane electrode and a fifth plane electrode on opposite sides of said insulating plate, said fourth and fifth plane electrodes providing a fourth coil and fourth capacitor which, together with said third coil, form the third circuit;
whereby a symmetrical bandpass filter printed circuit is provided having accurate coupling adjustment by trimming said third plane electrode common conductor to independently change coupling without changing the location of the first and second conductors of the third plane electrode.

6. A printed circuit as claimed in claim 5, in which a recess is formed in said first plane electrode between said first capacitor and second coupling capacitor and near a ground on said third plane electrode to reduce generation of a spurious response in the printed circuit bandpass.

7. A printed circuit as claimed in claim 6, in which another recess is formed in said fourth plane electrode between said second coupling capacitor and third capacitor to reduce generation of a spurious response in the printed circuit bandpass.

* * * * *